United States Patent
Hsieh

(10) Patent No.: US 7,459,350 B2
(45) Date of Patent: Dec. 2, 2008

(54) METHOD FOR FABRICATING A PROTECTION CIRCUIT LOCATED UNDER FUSE WINDOW

(75) Inventor: Chen-Hui Hsieh, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 128 days.

(21) Appl. No.: 11/463,526

(22) Filed: Aug. 9, 2006

(65) Prior Publication Data
US 2007/0002660 A1    Jan. 4, 2007

Related U.S. Application Data

(62) Division of application No. 10/748,097, filed on Dec. 30, 2003, now Pat. No. 7,098,491.

(51) Int. Cl.
*H01L 23/62* (2006.01)
(52) U.S. Cl. .................. 438/132; 438/215; 438/281
(58) Field of Classification Search ........... 438/132, 438/215, 237, 281
See application file for complete search history.

(56) References Cited

U.S. PATENT DOCUMENTS

| | | | |
|---|---|---|---|
| 4,455,194 A * | 6/1984 | Yabu et al. ........... | 438/601 |
| 5,652,689 A | 7/1997 | Yuan | |
| 5,729,041 A | 3/1998 | Yoo et al. | |
| 6,121,073 A * | 9/2000 | Huang et al. ......... | 438/132 |
| 6,157,065 A | 12/2000 | Huang et al. | |
| 2003/0094995 A1 | 5/2003 | Mori et al. | |
| 2003/0153135 A1 * | 8/2003 | Kim et al. ........... | 438/132 |
| 2003/0173597 A1 * | 9/2003 | Kamiya ............... | 257/209 |
| 2003/0228756 A1 * | 12/2003 | Lee et al. ........... | 438/689 |
| 2005/0161766 A1 * | 7/2005 | Sato et al. .......... | 257/529 |
| 2005/0236688 A1 * | 10/2005 | Bang et al. ......... | 257/529 |
| 2006/0118904 A1 * | 6/2006 | Liaw .................. | 257/529 |
| 2006/0289899 A1 * | 12/2006 | Yoon et al. .......... | 257/209 |
| 2007/0007621 A1 * | 1/2007 | Omura et al. ........ | 257/529 |
| 2007/0018279 A1 * | 1/2007 | Lin et al. ........... | 257/529 |

* cited by examiner

*Primary Examiner*—M. Wilczewski
*Assistant Examiner*—Toniae M. Thomas
(74) *Attorney, Agent, or Firm*—Haynes and Boone, LLP

(57) ABSTRACT

A method for making a semiconductor device having a fuse window above a substrate is disclosed. The semiconductor device has at least one fuse protection circuit located under the fuse window. The fuse protection circuit includes a fuse having a first end connected to a first voltage and a second end. A first transistor having a drain is connected to the second end of the fuse, a gate for receiving an input signal, and a source is connected to a second voltage. A second transistor having a drain is connected to the second end of the fuse, a gate, and a source is connected to the second voltage. A first diode having an anode and a cathode, the anode of the first diode is connected to the second voltage and the cathode of the first diode is connected to the second end of the fuse. A second diode having an anode and a cathode, the anode of the second diode is connected to the second end of the fuse and the cathode of the second diode is connected to the first voltage. A resistor having a first end is connected to the anode of the second diode, and a second end. An inverter having an input end is connected to the second end of the resistor, and an output end is connected to the gate of the second transistor for providing an output signal.

17 Claims, 3 Drawing Sheets

METHOD FOR FABRICATING A PROTECTION CIRCUIT LOCATED UNDER FUSE WINDOW

DOMESTIC PRIORITY CLAIM

This application is a divisional of U.S. patent application Ser. No. 10/748,097 filed Dec. 30, 2003, and entitled, "Protection Circuit Located Under Fuse Window," which is hereby incorporated by reference in its entirety.

BACKGROUND

The present invention relates generally to semiconductor devices and more specifically to fuse circuits employed in semiconductor devices.

The design concept of making redundant cells or circuits to replace defective cells or cells to be reconfigured is of vital application in the fabrication of integrated circuits. Defective cells on a chip which arose in the fabrication process are usually identified using a chip probe. The defective cells can then be replaced with redundant cells by the redefinition of connective paths. With such a reworking process to correct fabrication defects, the number of defective cells can be greatly reduced. The use of redundant cells is employed in most memory chips and logic circuit chips to increase the yield and reduce production costs.

There are several ways of modifying the connections to substitute redundant cells for defective cells. The use of a fuse circuit is one of the most widely employed methods for swapping defective cells with redundant cells. Typically, fuse circuits are incorporated in the integrated circuit design, and the fuses of the fuse circuits are selectively blown, for example, by passing an electrical current of sufficient magnitude to cause them to open. Frequently, fuses are blown by the use of laser. In such a case, a fuse window is normally formed through insulating layers above the fuse in the area where the fuse will be blown so that the laser heating will be more effective. The laser is focused through the fuse window, the fuse absorbs the heat from the laser irradiation and the fuse melts.

Typically, logic circuits are repaired or reconfigured by blowing fuses. For example, it is common to initially fabricate a generic logic chip having a large number of interconnected logic gates. Then in a final processing step, the chip is customized to perform a desired logic function by disconnecting the unnecessary logic elements by blowing the fuses that connect them to the desired circuitry. Still other applications of laser-blown fuses are possible.

Unfortunately, conventional semiconductor devices with fuse circuits have several drawbacks. One of the problems with these fuse circuits is that they do not contribute to the ordinary operation of the device. Further, they require silicon area that could otherwise be used for circuits that perform other functions. The space under a fuse window is normally unused. This lost space is significant considering the scaling down of features sizes in the sub-micron region and the fact that at least several hundred fuse circuits are required for each device. Further still, conventional semiconductor devices with fuse circuits do not adequately discharge the charge from an ESD during laser processing.

For these reasons and other reasons that will become apparent upon reading the following detailed description, there is a need to avoid using much or all of the silicon area that is occupied by fuse circuits, which silicon area could otherwise be used for circuits that perform other functions.

SUMMARY

In one embodiment, a semiconductor device having a fuse window overlying at least one fuse protection circuit is provided. A method of fabricating the semiconductor device having the fuse window overlying the at least one fuse protection circuit is also provided.

The specific embodiments of the invention have features and advantages that will be apparent in the description section.

BRIEF DESCRIPTION OF THE DRAWINGS

The features, aspects, and advantages of the present invention will become more fully apparent from the following detailed description, appended claims, and accompanying drawings in which;

DESCRIPTION

Figure 1:
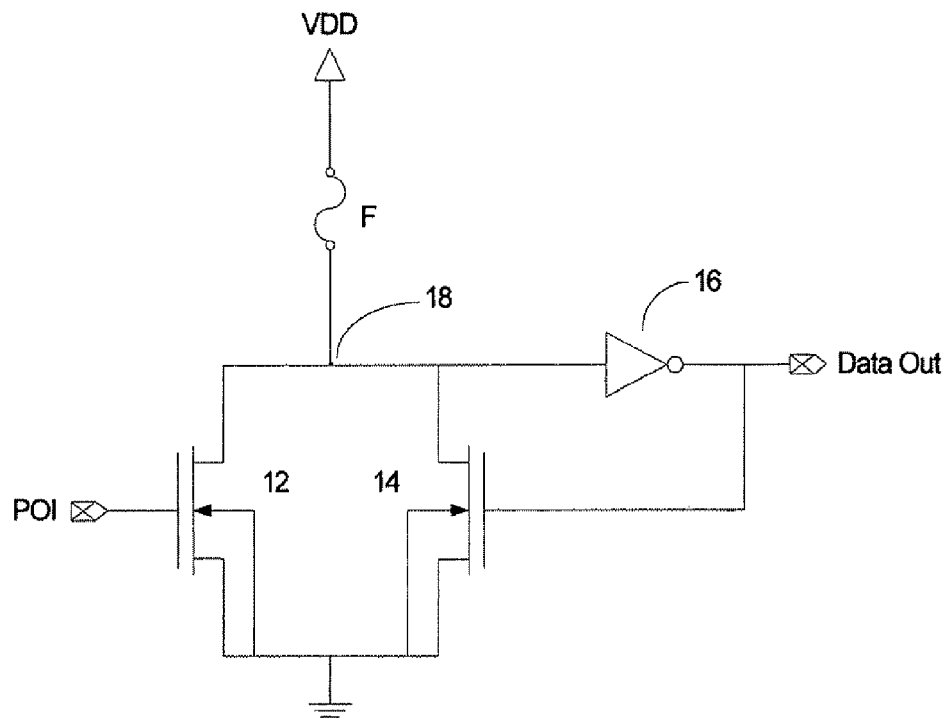
FIG. 1 is a schematic diagram of a fuse circuit.

In the following description, numerous specific details are set forth to provide a thorough understanding of the present invention. However, one having an ordinary skill in the art will recognize that the invention can be practiced without these specific details. In some instances, well-known circuits, structures and processes have not been shown in detail to avoid unnecessarily obscuring the present invention. Wherever possible, the same reference numbers are used in the drawings and the description to refer to the same or like parts.

FIG. 1 shows a fuse circuit formed of a fuse F, N-channel metal-oxide semiconductor (NMOS) transistors 12 and 14 and inverter 16. Fuse F is made of polysilicon or a conductive material that is capable of being cut out, or otherwise opened, by a laser, and has one end connected between power supply voltage $V_{DD}$ and a second end connected to a fuse sensing node 18. NMOS transistor 12 has a first current electrode (drain) connected to the second end of fuse 10, a control electrode (gate) connected to an input pin for receiving an input signal POI (Power On Initial), and a second current electrode (source) connected to ground. NMOS transistor 14 has a first current electrode (drain) connected to the second end of fuse F, a control electrode (gate), and a second current electrode (source) connected to ground. Fuse sensing node 18 is connected to an output terminal of the fuse circuit through inverter 16. Inverter 16 has an input end connected to fuse sensing node 18 and an output end connected to the control electrode of NMOS transistor 14 and to the output terminal for providing an output signal Data Out.

Operation of the fuse circuit shown in FIG. 1 is described as follows. Input signal POI goes high during a power on period for about several nano-seconds and then goes low during normal operation. A purpose of input signal POI is to reset fuse sensing node 18 to ground level during the device power on period. If fuse F is intact (not blown open), then after input signal POI goes low, NMOS transistor 12 is substantially non-conductive, fuse sensing node 18 will be pulled high by fuse F which is connected to power supply voltage $V_{DD}$ and through inverter 16, the output signal Data Out will go low. If fuse F is open, then after input signal POI goes low, fuse sensing node 18 will be kept low and inverter 16 provides a high and NMOS transistor 14 becomes conductive to lower the input end of inverter 16 down to low. Inverter 16 provides a high output signal Data Out. Essentially, this is the operation of the fuse circuit of FIG. 1.

Typically, when blowing fuses to modify the connections by substituting redundant cells for defective cells, voltage of an electrostatic discharge (ESD) are generated. This ESD voltage is generated during laser processing when laser is applied to fuse sensing node 18. The ESD voltage damages the thin gate oxide of inverter 16 of the fuse circuit. However, by adding protection diodes and resistors to the fuse circuit, the gate oxide of inverter 16 is protected.

Figure 2:
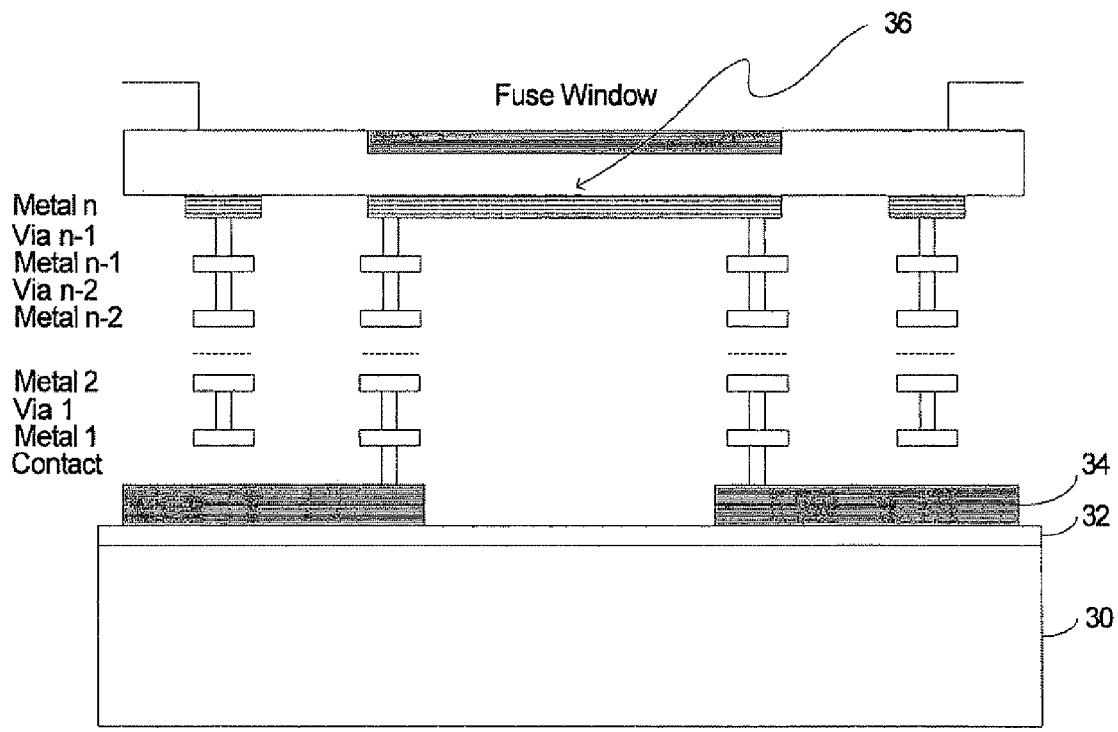
FIG. 2 is a cross-sectional view of a semiconductor device having a fuse window.

FIG. 2 is a cross-sectional view of a semiconductor device having a fuse window. The semiconductor device has a substrate 30, an oxide layer 32, patterned polysilicon layers 34, a contact, a number of metal and via layers, and a fuse window. Laser processing is applied at top metal, Metal$_n$ as shown by reference numeral 36.

Figure 3:
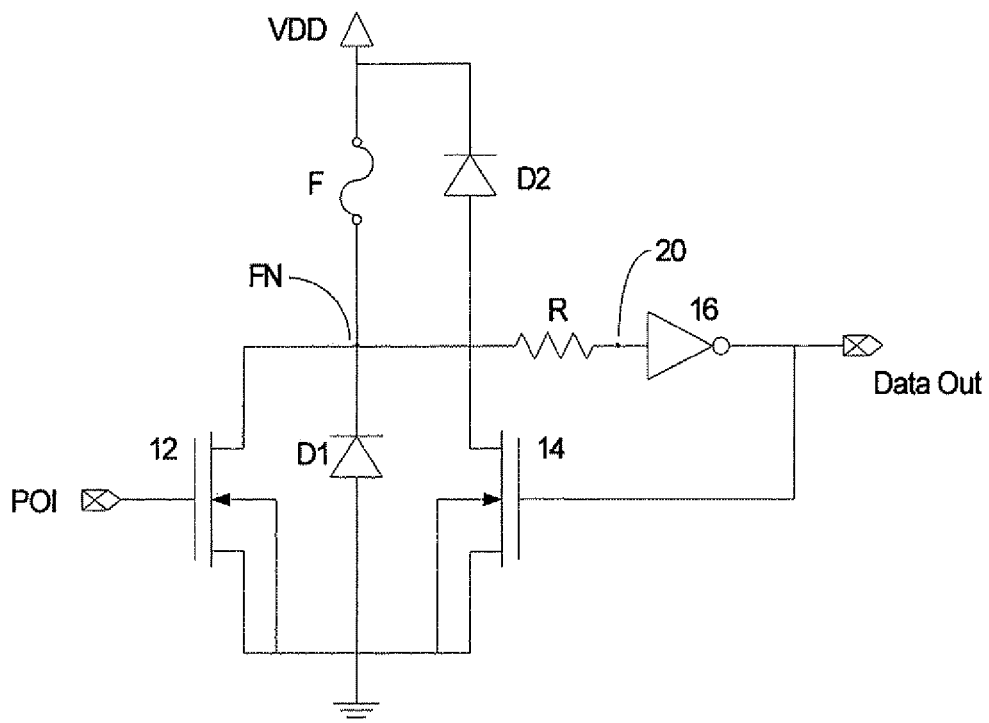
FIG. 3 is a schematic diagram of a fuse protection circuit according to one embodiment of the present invention.

Referring now to FIG. 3, a schematic diagram shows a fuse protection circuit for location under a fuse window according to one embodiment of the present invention. The fuse protection circuit is formed of a fuse F, N-channel metal-oxide semiconductor NMOS) transistors 12 and 14, diodes D1 and D2, resistor R and inverter 16. Diodes D1 and D2 and resistor R protect a fuse sensing node 20 of the fuse protection circuit. In particular, these protection diodes prevent damage to the thin gate oxide of the fuse sensing node 20. Resistor R is used to both attenuate the ESD voltage and also to absorb ESD energy. Fuse F is made of polysilicon or a conductive material that is capable of being cut out, or otherwise opened, by a laser, and has one end connected between power supply voltage $V_{DD}$ and a second end connected to a fuse node FN. In another embodiment, fuse F is an electrically blown fuse. NMOS transistor 12 has a first current electrode (drain) connected to the second end of fuse F, a control electrode (gate) connected to an input pin for receiving an input signal POI (Power On Initial), and a second current electrode (source) connected to ground. NMOS transistor 14 has a first current electrode (drain) connected to the second end of fuse F, a control electrode (gate), and a second current electrode (source) connected to ground. Diode D1 has an anode and a cathode, the anode is connected to ground and the cathode is connected to the second end of fuse F. Diode D2 has an anode connected to the second end of fuse F and the cathode connected to the supply voltage $V_{DD}$. Resistor R has a first end connected to the anode of diode D2, and a second end connected to inverter 16. Fuse sensing node 20 is connected to an output terminal of the fuse circuit through inverter 16. Inverter 16 has an input end connected to the second end of resistor R and an output end connected to the control electrode of NMOS transistor 14 and to the output terminal for providing an output signal Data Out.

The operation of the fuse circuit shown in FIG. 3 will now be described. Input signal POI goes high during a power on period for about several nano-seconds and then goes low during normal operation. Input signal POI resets fuse node EN to low during the device power on period. If fuse F is intact (not blown open), then after input signal POI goes low, NMOS transistor 12 is substantially non-conductive, fuse node FN will be pulled high by fuse F which is connected to power supply voltage $V_{DD}$ and through inverter 16, the output signal Data Out will go low. If fuse F is open, then after input signal POI goes low, fuse node FN will be kept low and inverter 16 provides a high and NMOS transistor 14 becomes conductive to lower the input end of inverter 16 down to low. Inverter 16 provides a high output signal Data Out.

Diode D1 functions as a negative accumulated charge discharge device. When negative charges accumulate on fuse node EN during the laser processing period, the voltage level of fuse node EN goes negative, and when the voltage level goes below the diode turn on voltage, $V_d$ ($V_d$=about 0.5V to about 0.7V), diode D1 turns on and discharges the voltage at fuse node FN to ground. For diode D2, diode D2 discharges fuse node EN to $V_{DD}$ if the voltage at fuse node FN is higher than the sum of $V_{DD}$ and $V_d$. Resistor R adds a voltage drop from fuse node EN to fuse sensing node 20 to prevent an instantaneous voltage surge accumulated at fuse node FN. Consequently, fuse sensing node 20 will sustain less voltage than fuse node EN to protect the thin gate oxide of inverter 16.

Figure 4:
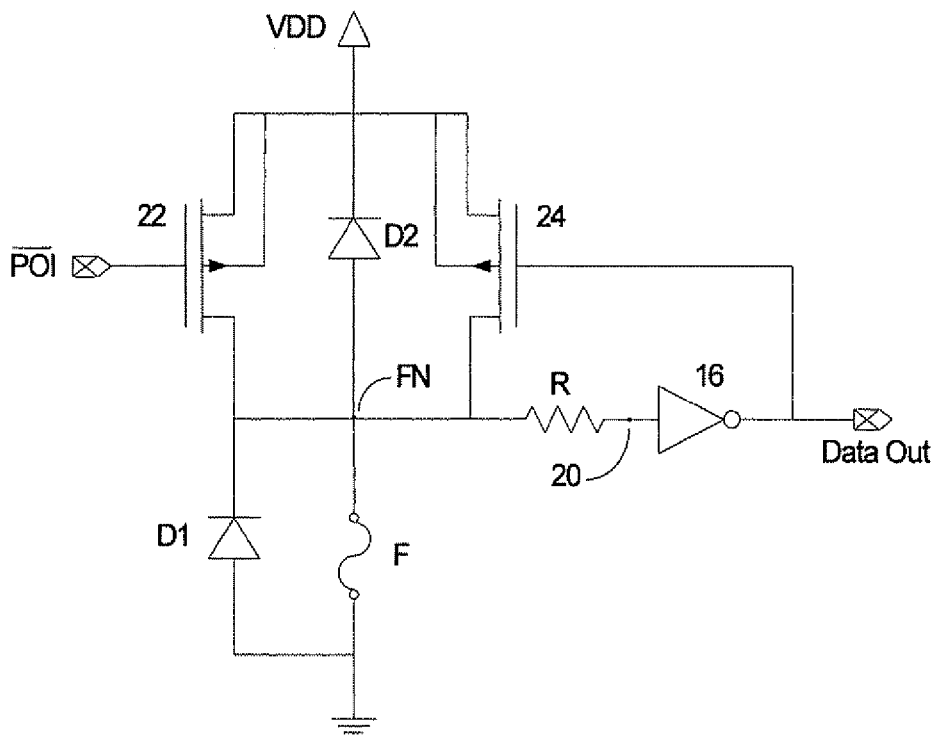
FIG. 4 is a schematic diagram of a fuse protection circuit according to one embodiment of the present invention.

FIG. 4 is a schematic diagram of a fuse protection circuit for location under a fuse window according to another embodiment of the present invention. The fuse protection circuit is formed of a fuse F, P-channel metal-oxide semiconductor (PMOS) transistors 22 and 24, diodes D1 and D2, resistor R and inverter 16. Fuse F is made of polysilicon or a conductive material that is capable of being cut out, or otherwise opened, by a laser, and has one end connected to ground and a second end connected to a fuse node FN. In another embodiment, fuse F is an electrically blown fuse. PMOS transistor 22 has a first current electrode (drain) connected to a power supply voltage $V_{DD}$, a control electrode (gate) connected to an input pin for receiving an input signal POI (Power On Initial), and a second current electrode (source) connected to the second end of fuse F. PMOS transistor 24 has a first current electrode (drain) connected to the power supply voltage $V_{DD}$, a control electrode (gate), and a second current electrode (source) connected to the second end of fuse F. Diode D1 has an anode and a cathode, the anode is connected to ground and the cathode is connected to the second end of fuse F. Diode D2 has an anode and a cathode, the anode is connected to the second end of fuse F and the cathode is connected to the power supply voltage $V_{DD}$. Resistor R has a first end connected to the second end of fuse F, and a second end connected to inverter 16. Inverter 16 has an input end connected to the second end of resistor R and an output end connected to the control electrode of PMOS transistor 24 and to the output terminal for providing an output signal Data Out.

The operation of the fuse protection circuit shown in FIG. 4 is described as follows. Input signal POI will go low during the power on period for about several nano-seconds and then go high during normal operation. Input signal POI resets fuse node FN to $V_{DD}$ level during the device power on period. If fuse F is intact (not blown open), then after input signal POI goes high, fuse node FN will be pulled low by fuse F which is connected to ground and through inverter 16, the output signal Data Out will go high. If fuse F is open, then after input signal POI goes high, fuse node FN will be kept high and through inverter 16 the output signal Data Out will go low. The low state of Data Out turns on PMOS transistor 24 and connects fuse node FN to power supply voltage $V_{DD}$; and inverter 16 and PMOS transistor 24 form a simple latch circuit to latch a signal of fuse node FN.

Diode D1 functions as a negative accumulated charge discharge device. When negative charges accumulate on fuse node FN during the laser processing period, the voltage level of fuse node FN will go negative, and when the voltage level goes below the diode turn on voltage, $V_d$ ($V_d$=0.5V to 0.7V), diode D1 is turned on and discharges the voltage at fuse node FN to ground. Diode D2 discharges fuse node FN to $V_{DD}$ if the voltage at fuse node FN is higher than the sum of $V_{DD}$ and $V_d$. Resistor R useful for attenuating the ESD voltage and for absorbing ESD energy adds a voltage drop from fuse node FN to fuse sensing node 20 to prevent an instantaneous voltage surge accumulated at fuse node FN. Therefore, fuse sensing node 20 will sustain less voltage than fuse node FN to protect the thin gate oxide of inverter 16.

Figure 5:
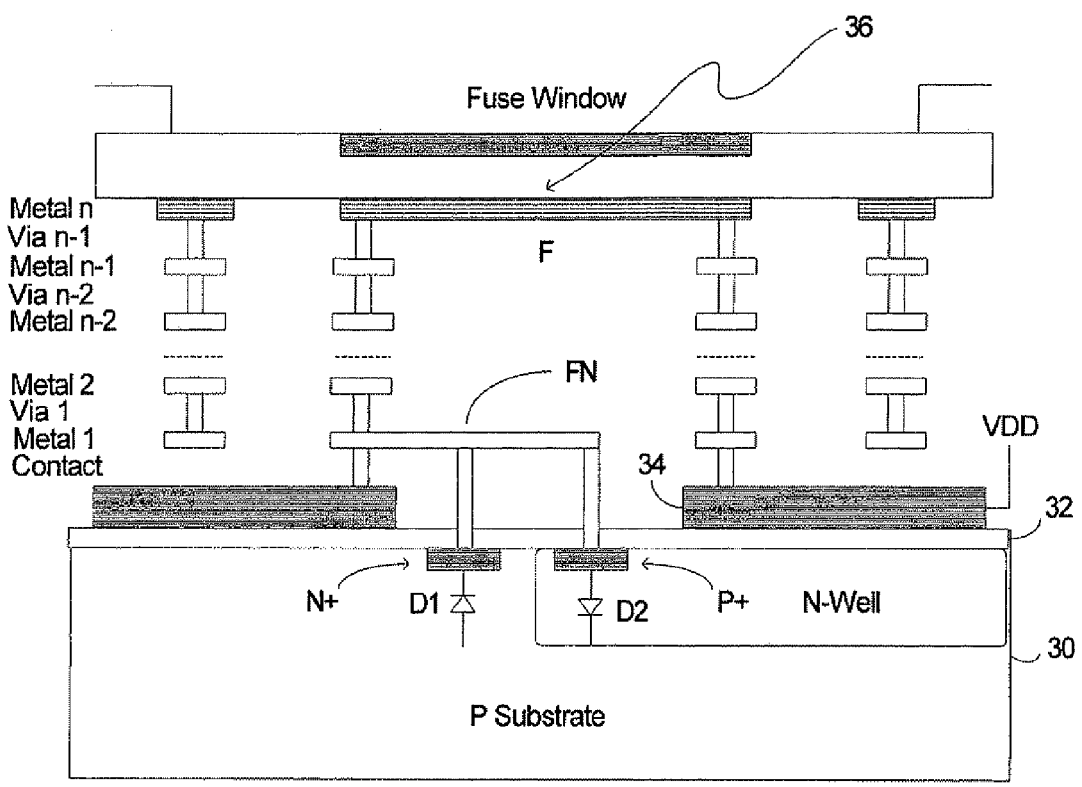
FIG. 5 is a cross-sectional view of a semiconductor device having a fuse protection circuit located under a fuse window according to one embodiment of the present invention.

FIG. 5 is a cross-sectional view of a semiconductor device having a fuse protection circuit located under a fuse window according to one embodiment of the present invention. The semiconductor device has a substrate 30, an oxide layer 32, patterned polysilicon layers 34, a contact, a number of metal and via layers, and a fuse window. It is understood that the semiconductor device of FIG. 5 is an exemplary embodiment for showing a fuse protection circuit located either directly or indirectly under a fuse window. In another embodiment, at least one device is located either directly or indirectly under the fuse window. In yet another embodiment, at least one interconnect structure is located either directly or indirectly under the fuse window. As one skilled in the art understands, various modifications and changes may be made to the arrangement of the various devices and interconnects located under the fuse window.

Laser processing is applied at top metal, Metal$_n$ as shown by reference numeral 36. The fuse protection circuit of the semiconductor device is located in substrate 30 and is located under the fuse window. The following describes the formation of the fuse protection circuit of FIG. 4 in substrate 30 under the fuse window. Diode D1 is formed by adding one N+diffusion area under the fuse window and diode D2 is formed by adding one P+diffusion area in an N-well under the fuse window. The anode of diode D1 if formed in the P substrate, which is connected to ground and the cathode of diode D1 is formed in the N+region, which is connected to fuse node FN. The anode of diode D2 is formed in the N-well's P+ diffusion region, which is connected to fuse node FN, and the cathode of diode 12 is formed in the N-well, which is connected to V$_{DD}$ (not shown), Portions of the fuse protection circuit of FIG. 4, however, have not been shown in FIG. 5 in order to avoid unnecessarily obscuring the present invention. By implementing diodes D1 and D2 and resistor R under the fuse window, much silicon area that could otherwise be used for circuits that perform other functions can be saved. Moreover, by locating diodes D1 and D2 closely to fuse F, when the charge from an ESD is generated during laser processing, the charge will discharge to V$_{DD}$ or V$_{SS}$ immediately, therefore protecting the fuse sensing nodes.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of fabricating a semiconductor device comprising:

providing a semiconductor substrate;

forming at least one fuse circuit in the semiconductor substrate, wherein the fuse circuit comprises:

a fuse having a first end connected to a first voltage, and a second end;

a first transistor having a first current electrode (drain) connected to the second end of the fuse, a control electrode (gate) for receiving an input signal, and a second current electrode (source) connected to a second voltage;

a second transistor having a first current electrode connected to the second end of the fuse, a control electrode, and a second current electrode connected to the second voltage;

a first diode having an anode and a cathode, the anode of the first diode connected to the second voltage and the cathode of the first diode connected to the second end of the fuse;

a second diode having an anode and a cathode, the anode of the second diode connected to the second end of the fuse and the cathode of the second diode connected to the first voltage;

a resistor having a first end connected to the anode of the second diode, and a second end; and an inverter having an input end connected to the second end of the resistor, and an output end connected to the control electrode of the second transistor for providing an output signal; and forming a fuse window overlying the at least one fuse circuit.

2. The method of claim 1, wherein the fuse is a blowable fuse.

3. The method of claim 1, wherein the first transistor is a metal-oxide semiconductor (MOS) transistor.

4. The method of claim 3, wherein the MOS transistor is a N-type MOS (NMOS) transistor.

5. The method of claim 1, wherein the second transistor is a metal-oxide semiconductor (MOS) transistor.

6. The method of claim 5, wherein the MOS transistor is a N-type MOS (NMOS) transistor.

7. A method of fabricating a semiconductor device comprising:

providing a semiconductor substrate;

forming at least one fuse circuit in the semiconductor substrate, wherein the fuse circuit comprises:

a fuse having a first end connected to a first voltage, and a second end;

a first transistor having a first current electrode (drain) connected to a second voltage, a control electrode (gate) for receiving an input signal, and a second current electrode (source) connected to the second end of the fuse;

a second transistor having a first current electrode connected to the second voltage, a control electrode, and a second current electrode connected to the second end of the fuse;

a first diode having an anode and a cathode, the anode of the first diode connected to the first voltage and the cathode of the first diode connected to the second end of the fuse;

a second diode having an anode and a cathode, the anode of the second diode connected to the second end of the fuse and the cathode of the second diode connected to the second voltage;

a resistor having a first end connected to the second end of the fuse, and a second end; and an inverter having an input end connected to the second end of the transistor, and an output end connected to the control electrode of the second transistor for providing an output signal; and forming a fuse window overlying the at least one fuse circuit.

8. The method of claim 7, wherein the fuse is a blowable fuse.

9. The method of claim 7, wherein the first transistor is a metal-oxide semiconductor (MOS) transistor.

10. The method of claim 9, wherein the MOS transistor is a P-type MOS (PMOS) transistor.

11. The method of claim 7, wherein the second transistor is a metal-oxide semiconductor (MOS) transistor.

12. The method of claim 11, wherein the MOS transistor is a P-type MOS (PMOS) transistor.

13. A method of fabricating a semiconductor device with a protected output signal, the method comprising:
    providing a semiconductor substrate;
    providing first and second voltage terminals on the substrate;
    connecting a first end of a fuse to the first voltage terminal;
    connecting an anode of a first diode to the second voltage and a cathode of the first diode connected to the second end of the fuse;
    connecting an anode of a second diode to the second end of the fuse and a cathode of the second diode to the first voltage;
    connecting a first end of a resistor to the anode of the second diode; and
    connecting an input of an inverter to a second end of the resistor, and connecting an output of the inverter to a circuit for providing the output signal.

14. The method of claim 13 further comprising:
    connecting a first current electrode of a first transistor to the second end of the fuse, connecting a control electrode of the first transistor to a power-on input signal, and connecting a second current electrode of the first transistor to the second voltage;
    connecting a first current electrode of a second transistor to the second end of the fuse, and connecting a second current electrode of the second transistor to the second voltage;
    connecting an output of the inverter to a control electrode of the second transistor.

15. The method of claim 14, wherein the first transistor is a metal-oxide semiconductor (MOS) transistor.

16. The method of claim 15, wherein the MOS transistor is a N-type MOS (NMOS) transistor.

17. The method of claim 16, wherein the second transistor is an N-type MOS (NMOS) transistor.

* * * * *